(12) United States Patent
Luiten

(10) Patent No.: US 10,529,536 B2
(45) Date of Patent: Jan. 7, 2020

(54) ELECTRON BEAM GENERATION FOR TRANSMISSION ELECTRON MICROSCOPE

(71) Applicant: Technische Universiteit Eindhoven, Eindhoven (NL)

(72) Inventor: Otger Jan Luiten, Eindhoven (NL)

(73) Assignee: Technische Universiteit Eindhoven, Eindhoven (NL)

( * ) Notice: Subject to any disclaimer, the term of this patent is extended or adjusted under 35 U.S.C. 154(b) by 0 days.

(21) Appl. No.: 15/769,170

(22) PCT Filed: Oct. 20, 2016

(86) PCT No.: PCT/EP2016/075202
§ 371 (c)(1),
(2) Date: Apr. 18, 2018

(87) PCT Pub. No.: WO2017/068030
PCT Pub. Date: Apr. 27, 2017

(65) Prior Publication Data
US 2018/0301317 A1     Oct. 18, 2018

Related U.S. Application Data

(60) Provisional application No. 62/244,070, filed on Oct. 20, 2015.

(51) Int. Cl.
*H01J 37/285* (2006.01)
*H01J 37/073* (2006.01)

(52) U.S. Cl.
CPC .......... *H01J 37/285* (2013.01); *H01J 37/073* (2013.01); *H01J 2237/083* (2013.01); *H01J 2237/2626* (2013.01)

(58) Field of Classification Search
USPC .......................................... 250/282
See application file for complete search history.

(56) References Cited

U.S. PATENT DOCUMENTS

| | | | |
|---|---|---|---|
| 5,144,194 A | * | 9/1992 | Agosti .................. H01J 25/025 315/5 |
| 6,366,021 B1 | | 4/2002 | Meddaugh |

(Continued)

OTHER PUBLICATIONS

Lassise, Miniaturized RF Technology for Femtosecond Electron Microscopy, PhD dissertation, Eindhoven : Technische Universiteit Eindhoven, 2012. Ch. 6. http://alexandria.tue.nl/extra2/739203.pdf.

(Continued)

*Primary Examiner* — Phillip A Johnston
(74) *Attorney, Agent, or Firm* — Lumen Patent Firm

(57) ABSTRACT

In one aspect, the present invention provides a method of generating an electron beam in a transmission electron microscopy device. The method includes: generating an electron pulse [306] by a pulsed electron source [300], accelerating the electron pulse in a first resonant microwave cavity [302], passing the accelerated electron pulse through a drift space [314], and correcting the energy spread of the accelerated electron pulse in a second resonant microwave cavity [304] by operating it out of phase by 90 degrees from the first resonant cavity [302].

15 Claims, 3 Drawing Sheets

(56) References Cited

U.S. PATENT DOCUMENTS

| | | |
|---|---|---|
| 6,856,105 B2 | 2/2005 | Yao |
| 7,262,566 B2 * | 8/2007 | Pirozhenko ............. H05H 9/04 |
| | | 250/396 R |
| 2005/0006582 A1 * | 1/2005 | Steigerwald ............ H01J 37/05 |
| | | 250/311 |

OTHER PUBLICATIONS

Verhoeven et al., Time-of-flight electron energy loss spectroscopy using TM110 deflection cavities. Structural Dynamics, 3, 054303 (2016); doi: 10.1063/1.4962698.

\* cited by examiner

ELECTRON BEAM GENERATION FOR TRANSMISSION ELECTRON MICROSCOPE

CROSS-REFERENCE TO RELATED APPLICATIONS

This application is a 371 of PCT application PCT/EP2016/075,202 filed Oct. 20, 20016. PCT/EP2016/075,202 filed Oct. 20, 2016 claims the benefit of U.S. Provisional application 62/244,070 filed on Oct. 20, 2015.

FIELD OF THE INVENTION

The present invention relates generally to techniques for producing electron beams for transmission electron microscopy devices. More specifically, it relates to improved methods for using resonant RF cavities to produce electron beams having very high energy stability.

BACKGROUND

State-of-the-art Transmission Electron Microscopy (TEM) is based on high-brightness electron beams with beam energies typically in the range 100-300 keV. The beam energy is provided by a high-voltage (100-300 kV) electrostatic accelerator. The use of such high-voltage power supplies is cumbersome and expensive, in particular because of the requirement of an energy spread less than 1 eV, i.e. a relative energy stability of the order of 1 ppm. For applications such as Electron Energy Loss Spectroscopy (EELS) much smaller energy spreads are desired (0.01 eV or less), which at present can only be realized by using expensive energy filters and simultaneously sacrificing a substantial part of the beam current.

An attractive alternative to high-voltage electrostatic acceleration in terms of complexity and costs is acceleration by means of time-dependent fields in resonant radiofrequency (RF) cavities, as is common in relativistic particle accelerators. However, due to the limited power stability of high-power RF amplifiers, RF acceleration can provide relative energy stabilities of $10^{-4}$ at best.

SUMMARY OF THE INVENTION

It is known to use a combination of bunching cavities and accelerating cavities to generate electron beams in pulsed mode with low energy dispersion. These bunching techniques are designed to increase the efficiency of a microwave accelerator in the sense that (1) a larger part of the electrons produced by a thermionic gun is injected in the accelerating section at the proper phase for acceleration by bunching the electron beam prior to acceleration; (2) which is accomplished with a single microwave generator, which simultaneously feeds both the bunching cavities and the accelerating cavities by having them separated by common walls with carefully designed holes.

In embodiments of the present invention, on the other hand, (1) the order of bunching cavities and accelerating cavities is opposite: first the electron pulses are accelerated in accelerating cavities and subsequently they are sent through cavities that correct for energy spread. The second set of cavities is operated at 90 degrees phase difference but they do not act as bunching cavities: they are operated at such power that they stop the pulses from expanding any further; this is less power than would be required for bunching. To achieve this (2) the energy correction 'bunching' cavities are separated from the accelerating cavities by a drift space; if the cavities were sharing a thin common wall, as in prior art techniques, the energy correction method of the present invention would not work.

Moreover, the smallest energy spread that can be achieved with prior techniques is limited by the stability of the microwave generator. For this reason these prior methods would not be suitable for high-resolution transmission electron microscopy.

Embodiments of the present invention and prior approaches differ in several significant respects:
the order of accelerating cavities and 90-degrees-phase-shifted cavities is opposite;
drift space between the two sets of cavities is absent and completely undesirable in prior techniques;
the functionality of the 90-degrees-phase-shifted cavities is entirely different;
the achievable relative energy spread is much smaller than in prior approaches; it could in fact improve substantially on prior approaches;
electron microscopy is not an application of prior approaches.

In one aspect, the present invention provides a method of generating an electron beam in a transmission electron microscopy device. The method includes: generating an electron pulse by a pulsed electron source, accelerating the electron pulse in a first resonant microwave cavity, passing the accelerated electron pulse through a drift space, and correcting the energy spread of the accelerated electron pulse in a second resonant microwave cavity by operating it out of phase by 90 degrees from the first resonant cavity.

Advantageously, this new type of Transmission Electron Microscope (TEM) with superior beam properties, based on relatively cheap technology, can be realized without the need of high-voltage electrostatic acceleration, while retaining sub-eV energy spread.

By using RF cavities for accelerating electrons, cumbersome high voltage techniques are no longer needed. By using a second set of RF cavities oscillating 90 degrees out of phase, the same energy spread, or even a lower energy spread, can be achieved as with high voltage electrostatic acceleration.

DETAILED DESCRIPTION

Figure 1:
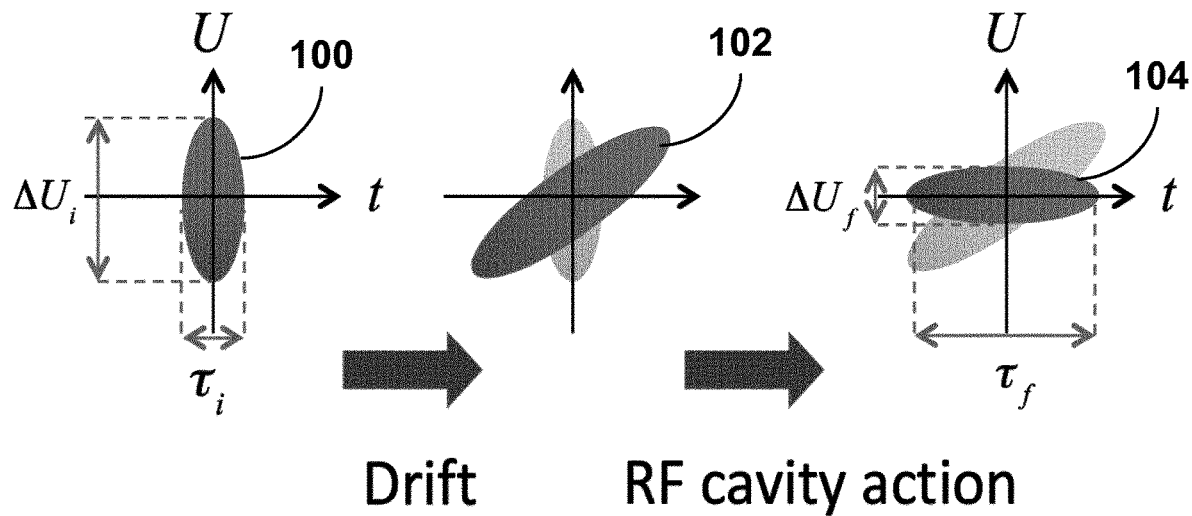
FIG. 1 shows the evolution of the longitudinal phase space distribution of a freely propagating pulse at three subsequent positions along the beam path, according to an embodiment of the invention.

The invention provides techniques for producing electron beams with very high energy stability using resonant RF cavities. In one aspect, two RF cavities oscillating 90 degrees out of phase are used, where the second cavity reduces the energy spread of the beam accelerated by the first cavity. The electron beam is pulsed at a time scale much less than the cavity oscillation period. The technique allows for the realization of transmission electron microscopy, which requires sub-eV energy spread, without the need for conventional high-voltage electrostatic acceleration. Such a combination of RF cavities may be realized in an electron microscope.

Embodiments of the invention include a combination of (at least) two separate resonant RF cavities. In the present description, each cavity can also be implemented as a set of (RF) cavities. Thus, without loss of generality, the following description will refer to first and second cavities, with the understanding that this is equivalent to first and second sets of cavities.

In a preferred embodiment, first RF cavity accelerates electrons to the desired beam energy, in which are subsequently sent into the second cavity. In the second cavity, the electrons experience RF fields oscillating 90 degrees out of phase with the fields experienced in the first cavity. In the second cavity, deviations from the targeted beam energy due to variations in the RF power are corrected by decelerating electrons which have too much energy and accelerating electrons which have too little energy.

A pulsed electron source is used with a pulse duration much shorter than the RF period, which delivers pulses in phase with the oscillation of the RF fields in the cavities. The oscillatory fields in the RF cavities are phase-locked, which can be realized by driving them all with a single RF source. The pulsed electron source can be realized by either pulsed (sub-)ps laser photoemission, pulsed (sub-)ps laser photoionization, or by pulsed field emission with RF fields. By using mode-locked lasers, the laser pulses can be synchronized to the phase of the RF fields at the appropriate level of accuracy.

Embodiments of the present invention make it possible to use RF acceleration while retaining low energy spread and thus realize low-energy spread, radiofrequency electron microscopy. For example, a few 100 keV TEM can be realized without the need of high-voltage electrostatic acceleration, while retaining sub-eV energy spread.

Following is a description of the theoretical principles underlying embodiments of the present invention. Consider an RF pillbox cavity with electromagnetic (EM) fields resonantly oscillating in the $TM_{010}$ mode, with the symmetry axis (z-axis) of the cylindrical cavity coinciding with the electron beam. In this case the electric field only has a field component in the z-direction:

$$\vec{E}(x,y,z,t) = E(x,y,z)\sin(\omega t + \varphi_0)\hat{z} \quad (1)$$

where $\omega$ is the RF oscillation frequency and $\varphi_0$ is the RF phase at time t=0. Close to the z-axis the field in a pillbox cavity can be approximated by:

$$\vec{E}(x,y,z,t) \approx E_0 \sin(\omega t + \varphi_0)\hat{z} \quad (2)$$

This approximation simplifies calculations but is not essential for the invention. Other resonant modes can be used as well. The momentum $p_z$ that is gained by a charged particle with charge q during passage through the acceleration cavity is given by:

$$p_z = \int_{-t_0}^{t_0} qE_0 \sin(\omega t + \varphi_0)dt = \quad (3)$$
$$\frac{qE_0}{\omega}(\cos(\omega t_0 + \varphi_0) - \cos(\varphi_0 - \omega t_0)) = -\frac{2qE_0}{\omega}\sin\varphi_0\sin\omega t_0$$

For $\varphi_0 = \pi/2$ and $t_0 = \pi/2\omega$ the maximum momentum gain is realized:

$$p_{z,max} = -\frac{2qE_0}{\omega} \quad (4)$$

Assume a particle with mass m is injected into the cavity at $t=-t_0=-\pi/2\omega$ with a velocity much smaller than the final velocity. This assumption is not essential but simplifies the calculations. Furthermore we neglect relativistic effects, which are not essential to explain the invention. The kinetic energy after acceleration is then given by:

$$U \approx \frac{2q^2 E_0^2}{m\omega^2} \quad (5)$$

As an example, consider a pillbox RF cavity, oscillating in $TM_{010}$ mode at a frequency of $\omega/2\pi=3$ GHz with an electric field amplitude $E_0=15$ MV/m. When an electron is injected with zero velocity at the proper RF phase for maximum acceleration it will be accelerated in this field to $U\approx200$ keV, comparable to beam energies typical for state-of-the-art TEMs. This can be achieved in a RF cavity $\Delta z=-\pi qE_0/m\omega^2=2$ cm in length with an RF power supply of a approximately 10 kW. By accelerating the electrons in several coupled cavities in a row the same final energy can be achieved with much less RF power.

Equation (3) shows how the final particle momentum after acceleration depends on $\varphi_0$ and $t_0$, i.e. on the synchronization of the moment of injection of the electron and the RF oscillation. For $t_0=\pi/2\omega$ and $\varphi_0 \ll 1$:

$$p_z \approx \frac{2qE_0}{\omega}\left(1 - \frac{\varphi_0^2}{2}\right) \quad (6)$$

RF phase instability $\Delta\varphi_0$ will therefore translate in relative momentum and energy spread:

$$\left|\frac{\Delta U}{U}\right| = 2\left|\frac{\Delta p_z}{p_z}\right| = \Delta\varphi_0^2 \quad (7)$$

For state-of-the-art TEMs, an energy stability $|\Delta U/U| \leq 10^{-6}$ is desired, and therefore an RF HI phase stability $|\Delta\varphi| \leq 10^{-3}$. For an RF frequency $\omega/2\pi=3$ GHz this corresponds to 50 fs electron injection stability. This is within present-day technical possibilities.

The energy stability of RF acceleration is generally limited by the stability of the high-power RF amplifier: $|(\Delta U/U)_{amp}|=|\Delta E_0/E_0|\geq 10^{-4}$, which is the main reason RF amplification is generally not used in Transmission Electron Microscopy.

Since the final energy after RF acceleration depends strongly on the RF phase, the resulting beam is pulsed, with a pulse length much shorter that the RF period: $\tau \ll 2\pi/\omega$, and a maximum pulse repetition rate $f_{rep,max}=\omega/2\pi$. In FIG. 1 the evolution of the longitudinal phase space distribution of a freely propagating pulse is illustrated by plotting the distribution of particles in longitudinal phase space at three subsequent spatial observation positions in the beam path. In the three plots the energy of the particles with respect to the average particle energy is plotted along the vertical axis; along the horizontal axis the arrival time of the particles at the observation point is plotted with t=0 corresponding to the arrival time of the central particle. The distributions 100, 102, 104 are schematically indicated by uniformly filled ellipses.

The initial distribution 100 is an uncorrelated time-energy distribution with an initial pulse duration $\tau_i$ and a finite energy spread $\Delta U_i = v_z \Delta p_z$, with $v_z$ the average velocity of the bunch of particles. The pulse duration will increase as the pulse propagates, with the more energetic, faster particles moving ahead and the less energetic, slower particles lagging behind, resulting in a distribution 102 in which particle energy U and time t are, to a good approximation, linearly correlated: a chirped beam. After a drift length L the most energetic particles will outrun the least energetic ones by a time difference $\tau = L \, \Delta v_z / v_z^2$. The energies of the individual particles do not change and the area of the elliptical distribution in longitudinal phase space is conserved: as the ellipse is tilted it is stretched in time, it becomes both longer and thinner.

The drift space gives rise to an energy-time or longitudinal-velocity-position correlation, which can be undone with the RF correction cavity to produce distribution 104, which has reduced energy spread.

The linear correlation can be undone by the time dependent field of a second RF cavity in $TM_{010}$ mode, operated with a field amplitude $E_1$ and a phase $\varphi_1$, so that the oscillating field close to the z-axis is given by:

$$\vec{E}_1(x,y,z,t) \approx E_1 \sin(\omega t + \varphi_1) \hat{z} \qquad (8)$$

If the pulse enters the second cavity at time $t=-t_1$ and exits at time $t=t_1$, the momentum change is given by $$\Delta p_{z,1} = \int_{-t_1}^{t_1} E_1 \sin(\omega t + \varphi_1) dt = -\frac{2qE_1}{\omega} \sin\varphi_1 \sin\omega t_1 \qquad (9)$$

If the particles at the center of the pulse experience a phase $\varphi_1 = 0$, no net momentum is gained after having passed through the cavity. The particles at the front of the pulse then experience a phase $\varphi_1 = -\omega \tau/2$ and those in the back a phase $\varphi_1 = \omega \tau/2$. If the second cavity is at a distance L form the acceleration cavity we have $\omega \tau = \omega L \, \Delta v_z / v_z^2 \ll 1$ so that $$\Delta p_{z,1} = -qE_1 L \cdot \sin \omega t_1 \Delta v_z / v_z^2 \qquad (10)$$

To undo the linear energy-time correlation, the momentum change induced by the second cavity should be equal to:

$$\Delta p_{z,1} = \Delta p_z / 2 \qquad (11)$$

which then results in an expression for the electric field amplitude $E_1$ for undoing the linear energy chirp acquired during drift over a distance L:

$$E_1 = \frac{-U}{qL\sin\omega t_1} \qquad (12)$$

For a well designed correction cavity $\omega t_1 = \pi/2$ and therefore $|E_{1,min}| = U/qL$. Example: for a beam energy U=400 keV and a distance L=0.5 m between accelerator cavity and correction cavity, a modest electric field amplitude $E_1$=0.8 MV/m can is sufficient to undo the energy chirp and thus minimize the energy spread. Note that any energy spread $\Delta U$ present at the beginning of the drift space (also the energy spread due to the limited stability of the RF amplifier) will be minimized as long as $\omega \, L \, \Delta v_z / v_z^2 \ll 1$.

The ultimately achievable minimum energy spread can be estimated using the fact that the product of pulse duration $\tau$ and energy spread $\Delta U$ is conserved for an unchirped beam, i.e., in absence of energy-time correlation (see FIG. 1):

$$\tau_i \cdot \Delta U_i = \tau_f \cdot \Delta U_f \qquad (13)$$

For example: a 100 fs pulse with $10^{-4}$ relative energy spread can be converted into a 10 ps pulse with $10^{-6}$ relative energy spread. The achievable energy spread is limited by the fact that the final pulse length should be much smaller than the RF period, so that the electron pulse experiences an electric field in the second cavity that changes sufficiently linearly in time.

In practice, the effectiveness of the correction cavity, and thus the achievable minimum energy spread, is also limited by (1) variations of the electric field amplitude $E_1$ in the correction cavity; (2) variations in the arrival time of the pulse in the correction cavity; (3) nonlinearity of the time dependence of the electric field experienced by the electrons in the correction cavity. These will now be discussed in more detail.

The dependence of the final energy spread on variation of the electric field amplitude of the correction cavity is given by $\Delta U_f = \Delta U_i (\Delta E_1 / E_1)$, which is completely negligible for typical variations $\Delta E_1 / E_1 \approx 10^{-4}$, caused by the limited stability of the RF amplifier.

Jitter of the cavity phase $\Delta \varphi_1$ with respect to the arrival time of the electron pulse will translate in arrival time jitter $\Delta \tau_f = \Delta \varphi_1 / \omega$, which amounts to less than 100 fs using presently available synchronization electronics. As a result $\Delta \tau_f / \tau_f \ll 1$, which makes this contribution negligible as well.

Around a zero crossing the electric field in the correction cavity can be approximated by $E_z(t) = E_1(\omega \Delta t - (\omega \Delta t)^3/6 + (\omega \Delta t)^5/120 + \ldots)$ where $\Delta t$ is the time with respect to the zero crossing. For proper operation of the correction cavity the field experienced by the electrons should have a linear time dependence. Using $|\Delta t| = \tau/2$ for the electrons in the front or the back of the pulse this implies $(\omega \tau_f)^2 / 24 \ll 1$. Assuming, for example, that we allow 1% nonlinearity, we find that $\tau_f \leq 0.5 \omega^{-1} \approx 25$ ps for a 3 GHz correction cavity.

Ideally the correction cavity should have an exactly linear time dependence, i.e. a saw tooth function, in which case $\tau_f \leq 150$ ps for a 3 GHz cavity.

Figure 2:
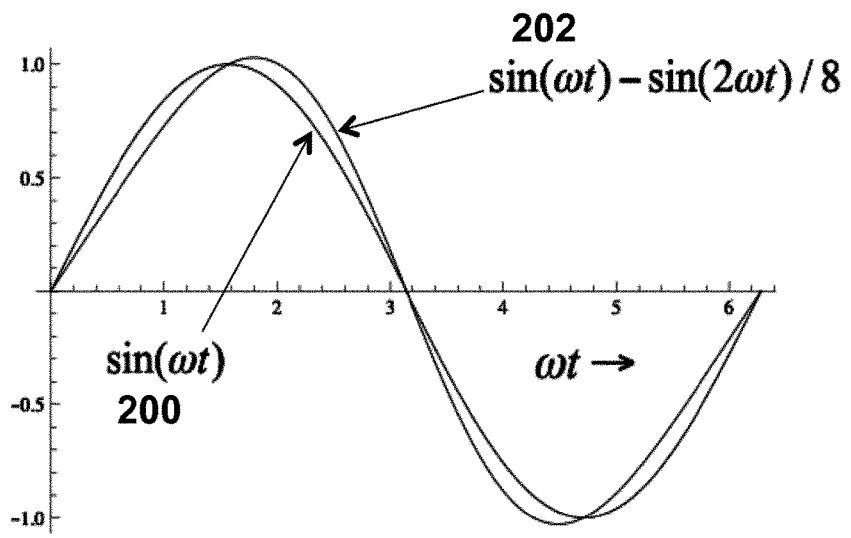
FIG. 2 is a graph of on-axis electric field strength vs time, showing both the electric field in case of regular single-frequency operation and the electric field resulting if the second harmonic is added, according to an embodiment of the invention.

The linearity of the electric field around the zero crossing can be improved, however, by allowing higher harmonics in the cavity as well. For example, adding a field at the second harmonic with the proper amplitude:

$$E_z(t) = E_1 \sin(\omega t) - (E_1/8)\sin(2\omega t) \qquad (14)$$

will eliminate third order nonlinearities at the zero crossing. The field given by Eq. (14) is illustrated in FIG. 2, in which the on-axis electric field strength is plotted as a function of time for two cases. One curve 200 shows the electric field in case of regular single-frequency operation, i.e. only the first term on the righthand side of Eq. (14); the other curve 202 shows the electric field resulting if the second harmonic is added with an amplitude as given in Eq. (14) Since the third order nonlinearity at the zero crossing has been removed, the nonlinearity criterion becomes $(\omega \tau_f / 2)^4 / 120 \ll 1$. Allowing 1% nonlinearity now results in $\tau_f \leq 2\omega^{-1} \approx 100$ ps and therefore substantial further reduction of the energy spread.

For a RF TEM according to embodiments of the present invention, a pulsed electron source is used, which produces ultrashort electron pulses that are synchronized to the RF phase of the cavities with a phase jitter $\Delta \varphi \leq \omega \tau_i$. For an initial pulse length $\tau_i$=100 fs the RF phase jitter should be $\Delta\varphi \leq 2\times 10^{-3}$. The phase jitter can be accomplished by either creating the electron pulses (1) directly in phase with the oscillating RF field or by generating electron pulses by (2) photoemission or (3) photoionization with a mode-locked femtosecond laser that is synchronized to the RF oscillation. The choice of the electron source is important, as it determines the initial pulse duration, the beam current, and the beam emittance.

Using an RF cavity in $TM_{110}$ mode as an ultrafast beam blanker, the continuous beam emitted by a standard field emission gun can be turned into a pulsed beam with conservation of the beam emittance and energy spread. The pulse train will have a repetition rate equal to the RF frequency and pulse durations of $\tau_i \leq 100$ fs can be achieved straightforwardly. The current may be boosted by applying an RF accelerating field to the field emitting tip so that electrons will preferentially be emitted when the oscillating RF field is maximal. These pulses are not necessarily ultrashort, but an RF beam blanker may be used to cut out the central part of the pulse, where the current peaks.

By femtosecond laser photoemission from a flat metal photocathode 100 fs electron pulses are readily created, but with a relatively poor emittance due to the large emission area. The resulting beam quality is insufficient for high-resolution TEM. Femtosecond pulses may also be generated by illuminating a sharp field emission tip from the side by a femtosecond laser pulse, with the linear polarization of the laser pulse pointing in the acceleration direction. Field enhancement of the optical field then leads to the emission of ultra-low-emittance femtosecond electron pulses. By femtosecond photoionization of an ultracold, laser-cooled atomic gas in a magneto-optical trap, low-emittance femtosecond electron pulses can be generated.

Figure 3:
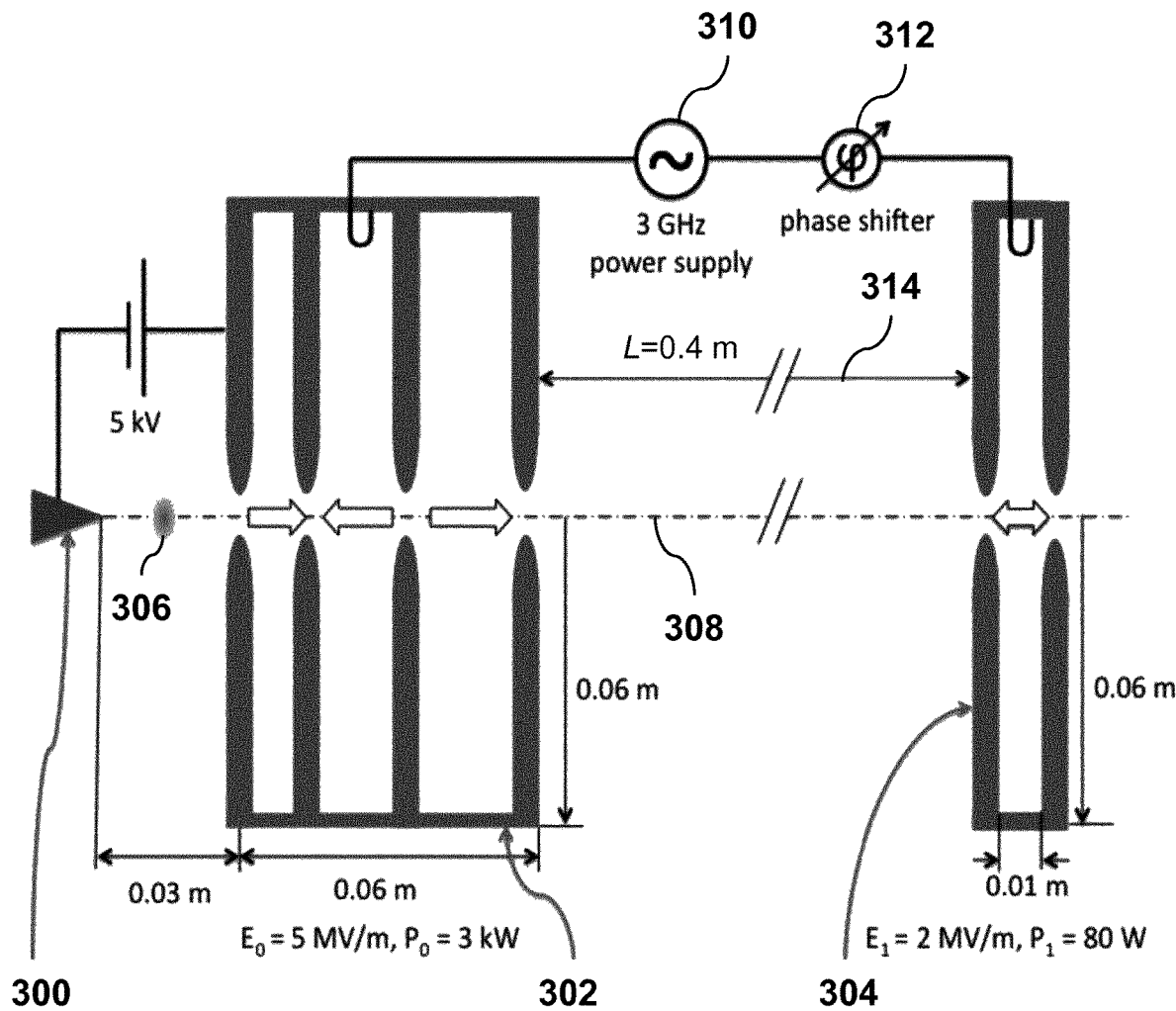
FIG. 3 is a schematic drawing of an energy-spread-corrected electron microscope, according to an embodiment of the invention.

FIG. 3 shows, according to one embodiment, a schematic drawing of a possible realization of an energy-spread-corrected electron microscope operating at 3 GHz and accelerating to 200 keV. The device includes three major parts: a 5 keV pulsed electron source 300, delivering (sub)picosecond electron pulses, synchronized to the phase of a radio frequency (RF) oscillator; the first resonant RF cavity 302, which acts as a 3 GHz RF accelerator, boosting the energy of the electron pulses 306 supplied by the pulsed electron source from 5 keV to 200 keV; the second RF resonant cavity 304, which has its the RF fields oscillating 90 degrees out of phase with the fields in the first cavity 302, thus acting as a 3 GHz RF energy spread corrector. In this embodiment, the pulsed source 300 is operated at 5 kV and the electron pulses 306 produced by the source travel 0.03 m before entering the first cavity 302. The electron beam path is indicated by the dashed line 308. The oscillating on-axis RF fields are indicated by thick arrows. The sizes of the RF cavities indicated are typical for pillbox cavities operating at 3 GHz in $TM_{010}$ mode. A single 3 GHz RF power supply 310 feeds RF power into both the first cavity 302 and the second cavity 304, thus assuring a fixed phase relation between the RF fields in cavities 302 and 304. A RF power supply has a RF oscillator and a RF amplifier. The first cavity 302 and the second cavity 304 can be operated each with its own RF amplifier. The signal fed into the RF amplifiers, however, is derived from a single RF oscillator to assure a fixed phase relation. A phase shifter 312 allows adjustment of the RF phase difference between cavity 302 and 304. The cavities 302 and 304 are separated by a drift space 314 of length L. In this embodiment the drift space 314 has length L=0.4 m. More generally, the value of L is preferably sufficiently large that the final $\tau_f$ is substantially larger than $\tau_i$. So, if $\tau_i$ is really small, then L can be relatively small as well, in theory. In practice, L is preferably larger than the cavity length, otherwise there would be no well-defined drift space. This implies that, in practice, L is preferably at least 10 cm.

The drift space between booster 302 and corrector 304 results in a correlation between position and longitudinal velocity in the electron pulses arriving at the corrector 304 (see FIG. 1) with the most energetic electrons arriving first and the least energetic electrons arriving last. By operating the corrector 304 at the proper RF field amplitude, which depends on the average energy of the electron pulse and the length of the drift space, the correlation can be undone, resulting in a reduced energy spread. By increasing the length of the drift space 314, the energy spread can be reduced further, until the pulse length acquired during drift becomes equal to one third of the RF period, e.g., 100 ps pulse length for 3 GHz RF frequency.

In practice, the availability of RF equipment and the sizes of the cavities allow the use of RF frequencies in the range 1-10 GHz. Low frequencies in principle allow further reduction of the energy spread but require large cavities and relatively large RF power.

The schematic drawing in FIG. 3 shows the possible realization for an RF frequency of 3 GHz. The cylindrically symmetric $TM_{010}$ pillbox cavities 302 and 304 are drawn to scale. In this realization, accelerator 302 is comprised of three stacked $TM_{010}$ pillbox cavities, with the length of each cavity such that the electrons experience half an RF period during passage. The three coupled cavities in booster module 302 collectively oscillate in three different resonant modes at slightly different resonant frequencies. The resonant mode that is selected has neighboring cavities oscillating in counter phase. As a result, the electrons keep on being accelerated when they move from one cavity to the next. As the speed increases, the length of the cavities is adjusted accordingly.

In the example of FIG. 3, the source 300 creates electrons by pulsed photo-emission, photo-ionization or field emission, and they are injected with an energy of 5 keV into the RF booster module 302. In module 302 a moderate RF field amplitude of $E_0$=5 MV/m is used to accelerate the electrons to 200 keV. In an optimized cavity design (not the pillbox cavities shown here) this corresponds to $P_0$=3 kW of RF power. The length of the drift space 314 in this example is L=0.4 m and the correction cavity has a length of 0.01 m. The RF electric field amplitude used to undo the correlation is $E_1$=2 MV/m. In an optimized cavity design this corresponds to $P_1$=80 W.

Figure 4:
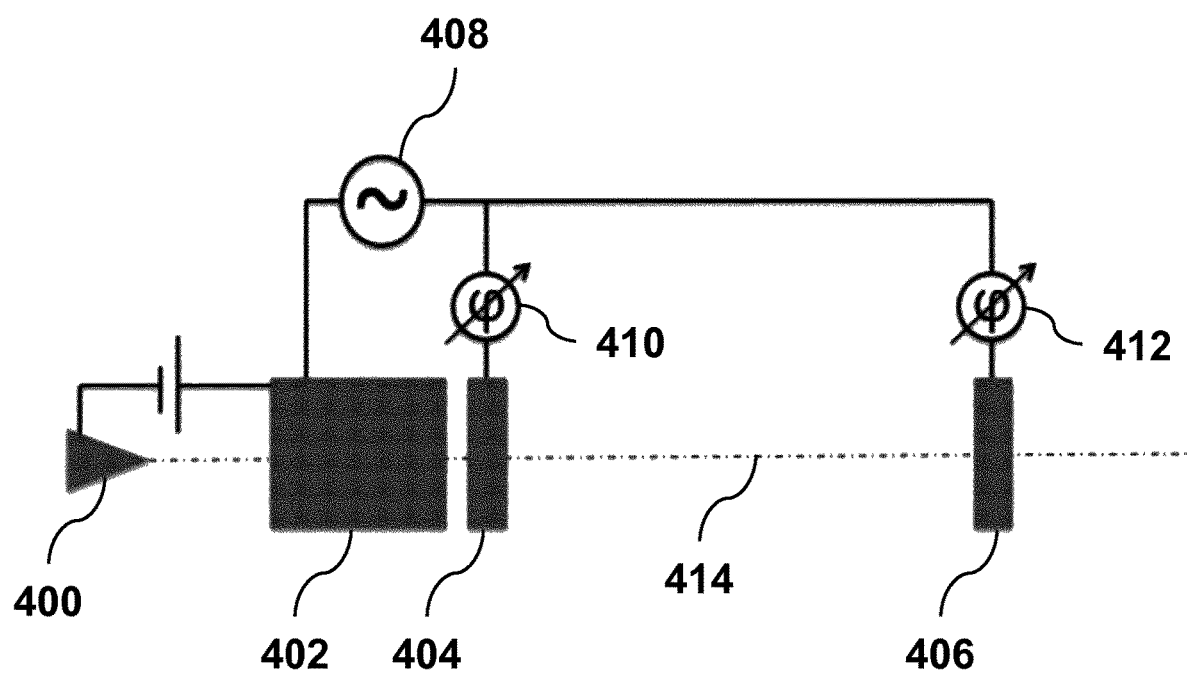
FIG. 4 is a schematic drawing of an energy-spread-corrected electron microscope including a decompression cavity, according to an embodiment of the invention.

For very small initial energy spreads, an impractically long drift space would be required to reduce the energy spread even further. By adding an additional decompression cavity, the length of the drift space can be reduced significantly. FIG. 4 is a schematic overview of a device according to an embodiment of the present invention, which is similar the embodiment of FIG. 3, except for the addition of a decompression cavity 404 and phase shifter 410. A pulsed source 400 generates electron pulses that follow a beam path 414. A single RF power supply 408 feeds power in the three RF cavities 402, 406 and 404. The phase shifters 410 and 412 allow adjustment of the relative phase between RF cavity 402 and 404 and the relative phase between cavity 402 and 406, respectively. Cavity 404 is identical in design to correction cavity 406 and is positioned in between booster cavity 402 and corrector cavity 406, oscillating −90 degrees out of phase with respect to the fields in 402, i.e. in counter phase (180 degrees) with respect to the field in corrector 406. Cavity 404 increases the correlated energy spread and thus minimizes the required length of drift space between 402 and 406.

The invention claimed is:

1. A method of generating an electron beam in a transmission electron microscopy device, the method comprising:
   generating an electron pulse by a pulsed electron source;
   accelerating the electron pulse in a first resonant microwave cavity;
   passing the accelerated electron pulse through a drift space; and
   correcting an energy spread of the accelerated electron pulse in a second resonant microwave cavity by operating the second resonant microwave cavity out of phase by 90 degrees from the first resonant cavity.

2. The method of claim 1 wherein accelerating the electron pulse in the first resonant microwave cavity comprises passing the electron pulse through a booster cavity followed by a decompression cavity, operating the decompression cavity out of phase by −90 degrees from the booster cavity and operating the decompression cavity out of phase by 180 degrees from the second resonant cavity.

3. The method of claim 1 wherein generating the electron pulse by the pulsed electron source comprises delivering the pulse in phase with an oscillation of the fields in the first resonant microwave cavity.

4. A device for generating an electron beam, the device comprising:
   a pulsed electron source configured to generate an electron pulse;
   a first resonant microwave cavity configured to accelerate the electron pulse;
   a second resonant microwave cavity configured to correct an energy spread of the accelerated electron pulse;
   a drift space separating the first resonant microwave cavity from the second resonant microwave cavity;
   a phase shifter connected to the first resonant microwave cavity and the second resonant microwave cavity, configured to adjust an RF phase difference between the first resonant microwave cavity and the second resonant microwave cavity to a value substantially equal to 90 degrees.

5. The device of claim 4 further comprising a RF power supply that feeds RF power into both the first resonant microwave cavity and the second resonant microwave cavity.

6. The device of claim 4 further comprising a decompression cavity positioned between the first resonant microwave cavity and the second resonant microwave cavity.

7. The device of claim 6 further comprising a second phase shifter configured to adjust an RF phase difference between the decompression cavity and the first resonant microwave cavity and a third phase shifter configured to adjust an RF phase difference between the decompression cavity and the second resonant microwave cavity.

8. The device of claim 7 wherein the second phase shifter is configured to adjust the RF phase difference between the decompression cavity and the first resonant microwave cavity to a value substantially equal to −90 degrees.

9. The device of claim 8 wherein the third phase shifter is configured to adjust an RF phase difference between the decompression cavity and the second resonant microwave cavity to a value substantially equal to 180 degrees.

10. The device of claim 4 wherein the drift space has length L larger than a total cavity length.

11. The device of claim 10 wherein the drift space has length L at least 10 cm.

12. The device of claim 11 wherein the drift space has length L=40 cm.

13. The device of claim 4 wherein the first resonant microwave cavity is a cylindrically symmetric $TM_{010}$ pillbox cavity.

14. The device of claim 4 wherein the first resonant microwave cavity comprises three stacked cylindrically symmetric $TM_{010}$ pillbox cavities.

15. The device of claim 4 wherein the second resonant microwave cavity is a cylindrically symmetric $TM_{010}$ pillbox cavity.

* * * * *